United States Patent
Hou et al.

(10) Patent No.: US 7,537,865 B2
(45) Date of Patent: May 26, 2009

(54) METHOD OF ADJUSTING SIZE OF PHOTOMASK PATTERN

(75) Inventors: Chia-Hsin Hou, Hsinchu (TW); Tsu-Yu Chu, Jhongli (TW)

(73) Assignee: United Microelectronics Corp., Hsinchu (TW)

( * ) Notice: Subject to any disclaimer, the term of this patent is extended or adjusted under 35 U.S.C. 154(b) by 527 days.

(21) Appl. No.: 11/375,408

(22) Filed: Mar. 13, 2006

(65) Prior Publication Data

US 2007/0212616 A1   Sep. 13, 2007

(51) Int. Cl.
*G03F 1/00* (2006.01)
*G06F 17/50* (2006.01)
*G06K 9/00* (2006.01)

(52) U.S. Cl. .............................. 430/5; 716/19; 382/144

(58) Field of Classification Search ............. 716/19–21; 430/5; 382/144
See application file for complete search history.

(56) References Cited

U.S. PATENT DOCUMENTS

| | | | |
|---|---|---|---|
| 7,452,639 B2 * | 11/2008 | Fu | 430/22 |
| 2001/0006753 A1 * | 7/2001 | Inoue | 430/5 |
| 2005/0089769 A1 * | 4/2005 | Fu | 430/5 |
| 2008/0113280 A1 * | 5/2008 | Osawa et al. | 430/5 |

* cited by examiner

*Primary Examiner*—Stacy A Whitmore
(74) *Attorney, Agent, or Firm*—J.C. Patents

(57) ABSTRACT

A method of adjusting the size of a photomask pattern is provided. First, the original coordinate is converted. Then the length and width of the original pattern are converted. Next, the size difference caused by the coordinate conversion is corrected according to the result of the length and width conversion.

4 Claims, 2 Drawing Sheets

METHOD OF ADJUSTING SIZE OF PHOTOMASK PATTERN

BACKGROUND OF THE INVENTION

1. Field of the Invention

The present invention generally relates to a method of adjusting the size of a photomask pattern. More particularly, the present invention relates to a method for adjusting the size of a photomask pattern.

2. Description of Related Art

Recently, in semiconductor industry, the design of circuit components is progressing towards miniaturization, and one of the most important steps in the semiconductor fabricating process is photolithography. The critical dimension (CD) of the patterns related to the structure of a semiconductor component, e.g. the patterns of various thin films, is a very important factor for accurately and reliably transferring patterns in photolithography. The CD tolerance on the chip will be affected and the exposure resolution will be reduced if there is an error in the transfer of the pattern.

Presently, to meet the size miniaturization of the semiconductor device, the original size photomask pattern is enlarged first, and then after re-wiring, the photomask pattern is reduced to the required size. However, the apparatuses or software currently used for manipulating the photomask patterns directly convert the coordinates of the pattern, in particular, all these coordinate adjustment are performed by rounding off all the decimal places of the calculated result. Accordingly, the size of original patterns may be different after being reduced or enlarged.

SUMMARY OF THE INVENTION

Accordingly, the present invention is directed to a method of adjusting the size of a contact window photomask pattern, which can ensure the changes in the size of the contact window photomask pattern and further improve the photo window.

The present invention provides a method of adjusting the size of a contact window photomask pattern including the following steps. First, a first contact window pattern having four corner coordinates $(x_1, y_1)$, $(x_2, y_1)$, $(x_1, y_2)$, and $(x_2, y_2)$ is provided. The first contact window pattern comprises a first length L and a first width W, wherein the first length L is the difference between $y_2$ and $y_1$, and the first width W is the difference between $x_2$ and $x_1$. Next, the size of the first contact window pattern is adjusted, wherein the change in the size of the first contact window pattern is assumed to be A. The steps of the adjustment include: performing coordinate conversion by multiplying $x_1$, $x_2$, $y_1$, and $y_2$ by A and rounding off all decimal places unconditionally, so as to obtain $x_1'$, $x_2'$, $y_1'$, $y_2'$ respectively and generate a second contact window pattern having four corner coordinates $(x_1', y_1')$, $(x_2', y_1')$, $(x_1', y_2')$, and $(x_2', y_2')$. The second contact window pattern comprises a second length L' and a second width W', wherein the second length L' is the difference between $y_2'$ and $y_1'$, and the second width W' is the difference between $x_2'$ and $x_1'$. Thereafter, the length conversion and width conversion are performed by multiplying the first length L and the first width W by A and rounding off all the decimal places unconditionally to obtain a third length L" and a third width W" respectively. Finally, the second length L' and the second width W' obtained at the step of coordinate conversion are adjusted based on the third length L" and the third width W".

According to an embodiment of the present invention, the step of coordinate conversion for adjusting the size of the first contact window pattern described above includes enlarging the first contact window pattern first and then reducing the first contact window pattern.

According to an embodiment of the present invention, the method of adjusting the second length L' described above includes reducing or increasing the second length L'.

According to an embodiment of the present invention, the method of adjusting the second width W' described above includes reducing or increasing the second width W'.

The present invention further provides a method of adjusting the size of a photomask pattern including the following steps. First, a pattern formed by a plurality of line segments is provided. Then, the size of the foregoing pattern is adjusted, and the change in the size of the pattern is set as A, then the size of each line segment of the pattern is adjusted. The aforementioned step of adjusting the size of each line segment of the pattern includes: a) selecting one of the line segments, wherein the coordinates of the two end points of the selected line segment are respectively $(x_1, y_1)$ and $(x_2, y_2)$, and the line segment has the first length $L=\sqrt{(x_2-x_1)^2+(y_2-y_1)^2}$; b) converting the coordinates of the selected line segment into $(x_1', y_1')$ and $(x_2', y_2')$, wherein $x_1'$, $x_2'$, $y_1'$, $y_2'$ are respectively obtained by multiplying $x_1$, $x_2$, $y_1$, $y_2$ by A and rounding off all decimal places unconditionally, and converting the first length L into the second length $L'=\sqrt{(x_2'-x_1')^2+(y_2'-y_1')^2}$; c) converting the first length into the third length L", wherein the third length L" is obtained by multiplying the first length L by A and rounding off all decimal places unconditionally; d) adjusting the second length L' based on the third length L"; e) repeating steps a)~d) until every line segment of the foregoing pattern has been adjusted.

According to an embodiment of the present invention, the aforementioned step b) includes enlarging the coordinates of the selected line segment first and then reducing the coordinates of the selected line segment.

According to an embodiment of the present invention, the method of adjusting the second length L' described above includes reducing or increasing the second length L'.

Since a correction step is added in the present invention, accurate manipulation in the size of the photomask pattern can be achieved by directly converting the length and width of the photomask pattern after adjusting the photomask pattern several times with the conventional coordinate conversion method. Accordingly, in the present invention, the original patterns will not be different after the sizes of the patterns are being adjusted.

In order to make the aforementioned and other objects, features and advantages of the present invention comprehensible, a preferred embodiment accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
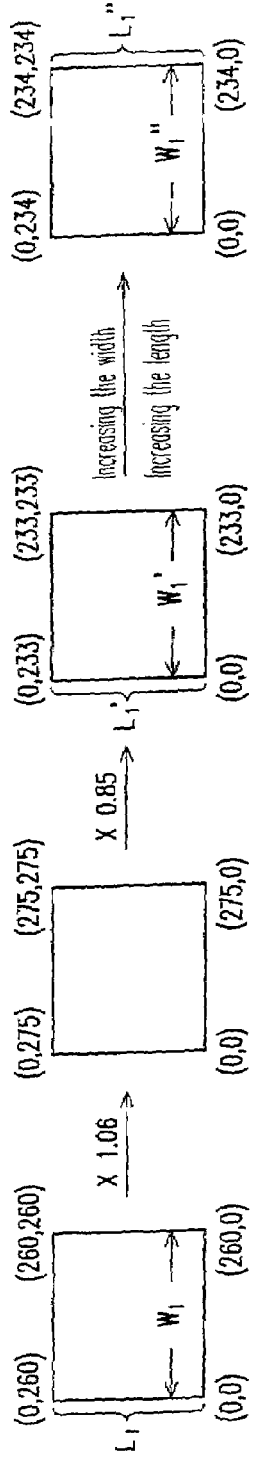
FIGS. 1A and 1B are diagrams illustrating the process of adjusting the size of a contact window photomask pattern according to an embodiment of the present invention.
Figure 1B:
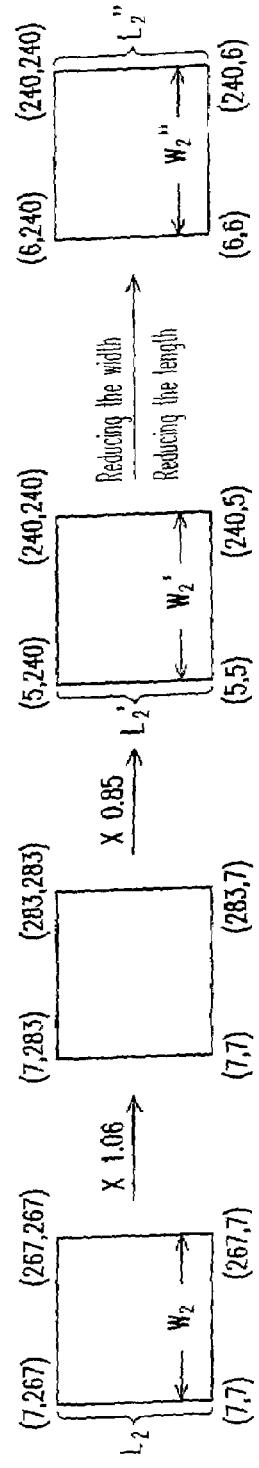

FIGS. 1A and 1B are diagrams illustrating the process of adjusting the size of a contact window photomask pattern according to an embodiment of the present invention.

First, referring to FIG. 1A, the coordinates of the leftmost original contact window pattern are respectively (0, 0), (260, 0), (0, 260), and (260, 260), that is, $x_1=0$, $y_1=0$, $x_2=260$, and $y_2=260$, and the first length $L_1$ thereof is the difference between $y_2$ and $y_1$, the first width $W_1$ thereof is the difference between $x_2$ and $x_1$, which are both 260.

Next, referring to FIG. 1A again, the size of the contact window pattern is adjusted, and the change in the size of the contact window pattern is predetermined as 0.9 times, that means the entire photomask pattern is to be reduced. In addition, the reduction in the size of the photomask pattern will also result in the reduction in the width of the "line" pattern therein, so that the "line" pattern may not be exposed during the photolithography process, that is, the "line" pattern may break off or disappear. Therefore, the original photomask pattern is generally enlarged first, in the present embodiment it is enlarged 1.06 times. The coordinate conversion in the present embodiment of the present invention include respectively multiplying $x_1$, $x_2$, $y_1$, $y_2$ by 1.06 (×1.06) and rounding off all decimal places unconditionally, so as to obtain four coordinates (0, 0), (275, 0), (0, 275), and (275, 275).

Next, referring to FIG. 1A again, the enlarged photomask pattern is reduced, e.g. 0.85 times (×0.85), after re-wiring, so as to obtain the change of 0.9 times in the size of the entire photomask pattern. And the four coordinates are obtained through coordinate conversion are (0, 0), (233, 0), (0, 233), and (233, 233). Here, the contact window pattern has the second length $L_1'$ and the second width $W_1'$, wherein the second length $L_1'$ is the difference between $y_2'$ and $y_1'$, and the second width $W_1'$ is the difference between $x_2'$ and $x_1'$, which are both 233.

Thereafter, referring to FIG. 1A again, the length and width of the pattern are required to be converted since the size difference of the pattern caused by the coordinate conversion is required to be corrected. First, the first length $L_1$ and the first width $W_1$ are multiplied by 0.9 and all decimal places are rounded off unconditionally, so as to obtain the third length $L_1''$ and the third width $W_1''$, which are both 234. Finally, the second length $L_1'$ and the second width $W_1'$ obtained through the coordinate conversion are adjusted based on the third length $L_1''$ and the third width $W_1''$. In other words, the length and width of the contact window photomask pattern in the present embodiment need to be increased based on the conversion result of the length and the width after the coordinate conversion, so as to obtain the rightmost contact window photomask pattern as shown in the figure.

In addition, the pattern and change in the size thereof shown in FIG. 1B are the same as those shown in FIG. 1A. However, the coordinates of the contact window photomask pattern in FIG. 1B, which are (7, 7), (267, 7), (7, 267), and (267, 267) respectively, are different from those in FIG. 1A, that is, $x_1=7$, $y_1=7$, $x_2=267$, and $y_2=267$, and the first length $L_2$ and the first width $W_2$ thereof are 260. Then the coordinates obtained by enlarging the photomask pattern are (7, 7), (283, 7), (7, 283), and (283, 283). Next, the enlarged pattern is reduced after re-wiring, so that the change in the size of the entire photomask pattern is 0.9 times. Four coordinates are obtained as (5, 5), (240, 5), (5, 240), and (240, 240) through the coordinate conversion, and the second length $L_2'$ and the second width $W_2'$ are 235. It should be noted that even though the size of the present pattern is the same as the size of the original pattern in FIG. 1A, only the difference in the coordinates may result in different sizes after the size of the photomask patterns have been changed. Thus, correction has to be performed to allow the final contact window photomask pattern to have the third length $L_2''$ and the third width $W_2''$, thus the corrected four coordinates (6, 6), (240, 6), (6, 240), and (240, 240) can be obtained.

Figure 2:
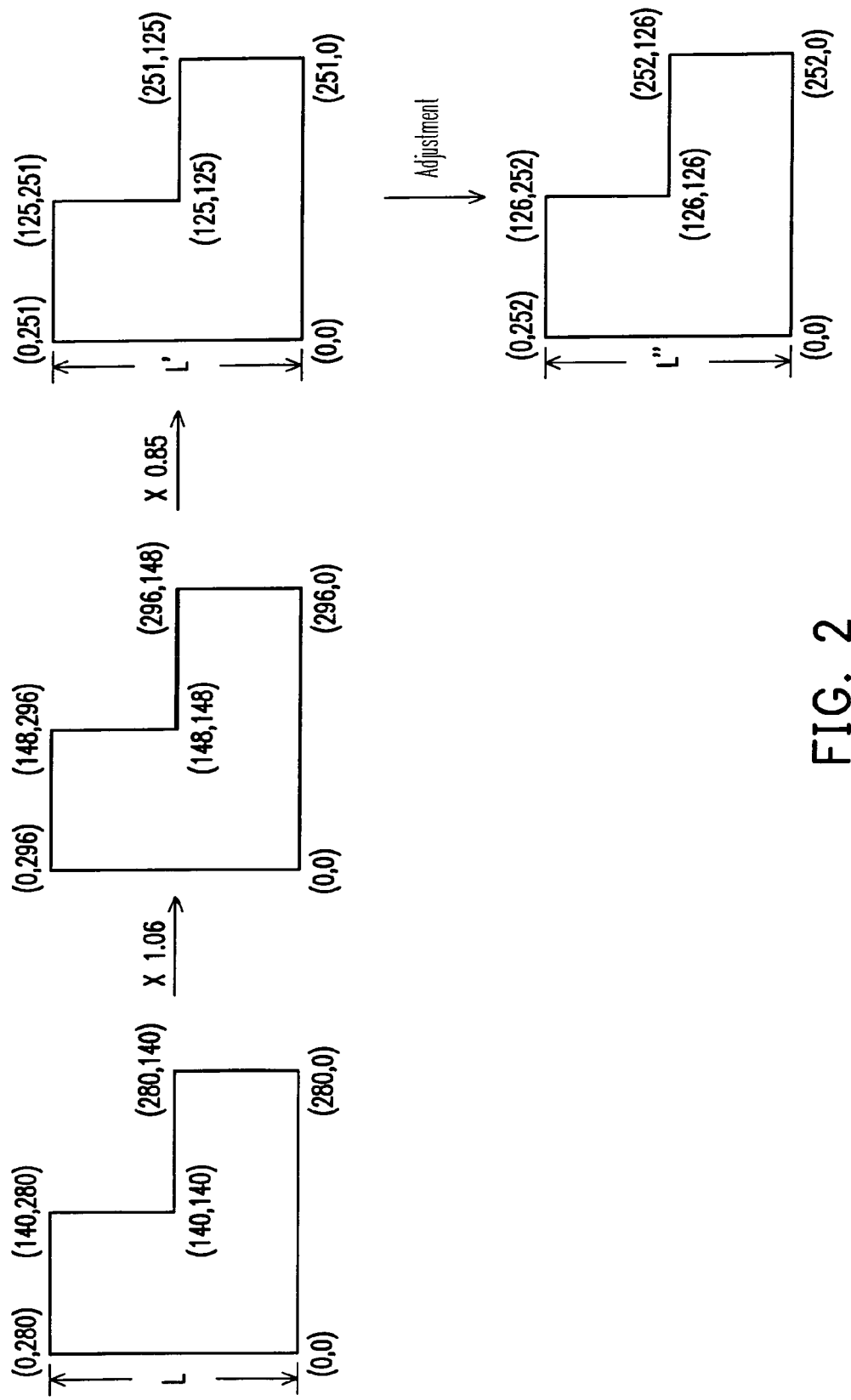
FIG. 2 is a diagram illustrating the changes in the size of a photomask pattern according to another embodiment of the present invention.

Besides the contact window, the present invention can also be applied to other polygonal photomask patterns, as shown in FIG. 2, which is a diagram illustrating the change in the size of a photomask pattern according to another embodiment of the present invention.

Referring to FIG. 2, assuming that the photomask pattern is a pattern formed by 6 line segments and is slightly in L shape, the coordinates thereof are (0, 0), (280, 0), (280, 140), (140, 140), (140, 280), and (0, 280) respectively. Then, the size of each line segment of the L-shape pattern is adjusted to achieve the purpose of adjusting the size of the entire pattern, and the change in the size of the pattern is set as 0.9 times as in the previous embodiment.

Next, referring to FIG. 2, the size of each line segment of the photomask pattern is adjusted; for example, a) a line segment of coordinates (0, 0) and (0, 280) among the six line segments is selected, that is, $x_1=0$, $y_1=0$, $x_2=0$, and $y_2=280$, and the first length thereof $L=\sqrt{(x_2-x_1)^2+(y_2-y_1)^2}=280$.

Next, referring to FIG. 2 again, b) the coordinates of the selected line segment are converted into $(x_1', y_1')$, $(x_2', y_2')$. And to re-wire, the line segment has to be enlarged first, thus the original coordinates are multiplied by 1.06 (×1.06) and all decimal places are rounded off unconditionally to obtain (0, 0) and (0, 296). After that, the line segment is reduced after re-wiring by multiplying the enlarged coordinates by 0.85 (×0.85) and rounding off all decimal places, so as to obtain (0, 0) and (0, 251), wherein $x_1'=0$, $y_1'=0$, $x_2'=0$, and $y_2'=251$. Here, the first length L becomes the second length $L'=\sqrt{(x_2'-x_1')^2+(y_2'-y_1')^2}=251$.

Next, referring to FIG. 2, c) the first length is converted into the third length L", wherein the third length L"=L×0.9 and all decimal places are rounded off unconditionally, so that L" should be 252. Accordingly, d) the second length L' needs to be adjusted, i.e. the length is increased, based on the third length L". After that, e) the aforementioned steps a)~d) are repeated until every line segment of the L-shape pattern has been adjusted.

In overview, according to the present invention, the purpose of correcting the photomask pattern can be achieved by directly converting the length and width of the photomask pattern after the size of the photomask pattern has been adjusted several times with conventional coordinate conversion method. Moreover, since the size of the photomask pattern can be changed accurately, the situation of obtaining different patterns after the manipulation of the sizes of the patterns may be effectively avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of adjusting the size of a contact window photomask pattern of a photomask, comprising:

providing a first contact window pattern comprising four corner coordinates including $(x_1, y_1)$, $(x_2, y_1)$, $(x_1, y_2)$ and $(x_2, y_2)$ respectively, the first contact window pattern having a first length L and a first width W, wherein the first length L is a difference between $y_2$ and $y_1$, and the first width W is a difference between $x_2$ and $x_1$; and adjusting a size of the first contact window pattern, wherein the adjusted size of the first contact window pattern is A, wherein the step of adjusting the size of the first contact window pattern comprises:

multiplying $x_1$, $x_2$, $y_1$, and $y_2$ by A respectively and rounding off all decimal places to obtain $x_1'$, $x_2'$, $y_1'$, $y_2'$, and a second contact window pattern comprising four corner coordinates including $(x_1', y_1')$, $(x_2', y_1')$, $(x_1', y_2')$ and $(x_2', y_2')$, and having a second length L' and a second width W', wherein the second length L' is a difference between $y_2'$ and $y_1'$, and the second width is a difference between $x_2'$ and $x_1'$;

multiplying the first length L and the first width W by A respectively and rounding off all decimal places to obtain a third length L" and a third width W"; and adjusting the second length L' and the second width W' based on the third length L" and the third width W".

2. The method as claimed in claim 1, wherein the step of adjusting the size of the first contact window pattern includes enlarging the first contact window pattern and reducing the first contact window pattern.

3. The method as claimed in claim 1, wherein the method of adjusting the second length L' includes reducing or increasing the second length L'.

4. The method as claimed in claim 1, wherein the method of adjusting the second width W' includes reducing or increasing the second width W'.

* * * * *